US010404220B2

(12) United States Patent
Sun et al.

(10) Patent No.: US 10,404,220 B2
(45) Date of Patent: Sep. 3, 2019

(54) TWO-STAGE OPERATIONAL AMPLIFIER

(71) Applicant: BOE TECHNOLOGY GROUP CO., LTD., Beijing (CN)

(72) Inventors: Gaoming Sun, Beijing (CN); Chulgyu Jung, Beijing (CN); Shou Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/572,307

(22) PCT Filed: Apr. 21, 2017

(86) PCT No.: PCT/CN2017/081327
§ 371 (c)(1),
(2) Date: Nov. 7, 2017

(87) PCT Pub. No.: WO2017/211134
PCT Pub. Date: Dec. 14, 2017

(65) Prior Publication Data
US 2018/0234056 A1 Aug. 16, 2018

(30) Foreign Application Priority Data

Jun. 6, 2016 (CN) .......................... 2016 1 0394391

(51) Int. Cl.
*H03F 3/45* (2006.01)
*H03F 1/14* (2006.01)
(Continued)

(52) U.S. Cl.
CPC ................ *H03F 1/14* (2013.01); *H03F 1/02* (2013.01); *H03F 1/0205* (2013.01); *H03F 1/26* (2013.01);
(Continued)

(58) Field of Classification Search
CPC .......... H03F 1/14; H03F 1/02; H03F 3/45636; H03F 2203/45051; H03F 3/45;
(Continued)

(56) References Cited

U.S. PATENT DOCUMENTS 4,730,168 A * 3/1988 Senderowicz ........ H03F 3/3001
330/253
5,285,168 A * 2/1994 Tomatsu ............... H03F 3/3001
330/253

(Continued)

FOREIGN PATENT DOCUMENTS

CN      101098123 A      1/2008
CN      101414487 A      4/2009

(Continued)

OTHER PUBLICATIONS

Chinese office action dated Apr. 18, 2018 for corresponding application No. 201610394391.9 with English translation attached.

(Continued)

*Primary Examiner* — Khanh V Nguyen
(74) *Attorney, Agent, or Firm* — Nath, Goldberg & Meyer; Joshua B. Goldberg; Daniel Bissing

(57) ABSTRACT

A two-stage operational amplifier is provided to comprise a bias voltage generator, a first stage operational amplifier and a second stage operational amplifier, wherein the first stage operational amplifier comprises a folded cascode amplifier circuit and a cross coupling load, the cross coupling load is coupled to a load differential pair in the folded cascode amplifier circuit, the cross coupling load comprises two transistors, the two transistors in the cross coupling load and two transistors in the load differential pair constitute two current mirror structures, which are cross coupled. In the solution, the cross coupling load is added to the load differential pair in the folded cascode amplifier circuit, to increase gain of the two-stage operational amplifier by using (Continued)

positive feedback and negative conductance gain enhancement technology; while parameters of MOSFETs in the folded cascode amplifier circuit are properly set to reduce noise of the two-stage operational amplifier.

19 Claims, 3 Drawing Sheets

(51) Int. Cl.
    *H03F 1/02*     (2006.01)
    *H03F 1/26*     (2006.01)
    *H03F 3/30*     (2006.01)

(52) U.S. Cl.
    CPC ....... *H03F 3/3022* (2013.01); *H03F 3/45192* (2013.01); *H03F 3/45636* (2013.01); *H03F 2203/45051* (2013.01); *H03F 2203/45644* (2013.01)

(58) Field of Classification Search
    CPC ............. H03F 3/45179; H03F 3/45183; H03F 3/45188; H03F 3/45192; H03F 2200/177; H03F 1/307; H03F 3/30; H03F 3/3001; H03F 3/3022
    USPC ........................................ 330/253, 255, 261
    See application file for complete search history.

(56) References Cited

U.S. PATENT DOCUMENTS

| | | | | |
|---|---|---|---|---|
| 5,465,073 | A | | 11/1995 | Satoh |
| 6,208,208 | B1 | * | 3/2001 | Komatsu ............... H03F 3/3028 |
| | | | | 330/255 |
| 6,316,998 | B1 | * | 11/2001 | Oikawa ................... H03F 1/086 |
| | | | | 330/255 |
| 6,590,980 | B1 | * | 7/2003 | Moraveji ............ H03F 3/45192 |
| | | | | 327/561 |
| 6,600,483 | B1 | * | 7/2003 | Akita ....................... G09G 3/36 |
| | | | | 345/204 |
| 7,078,970 | B2 | * | 7/2006 | Ruck ....................... H03F 3/303 |
| | | | | 330/255 |
| 7,576,610 | B2 | * | 8/2009 | Dalena ................ H03F 3/45183 |
| | | | | 330/255 |
| 8,405,459 | B2 | * | 3/2013 | Maruyama .......... H03F 3/45192 |
| | | | | 330/255 |

FOREIGN PATENT DOCUMENTS

| | | | |
|---|---|---|---|
| CN | 101635560 | A | 1/2010 |
| CN | 102480276 | A | 5/2012 |
| CN | 102510267 | A | 6/2012 |
| CN | 103199807 | A | 7/2013 |
| CN | 103558890 | A | 2/2014 |
| CN | 103633954 | A | 3/2014 |
| CN | 103825565 | A | 5/2014 |
| CN | 104158501 | A | 11/2014 |
| CN | 104393846 | A | 3/2015 |
| CN | 104467714 | A | 3/2015 |
| CN | 104660195 | A | 5/2015 |
| CN | 105429599 | A | 3/2016 |
| CN | 106026937 | A | 10/2016 |
| CN | 205681381 | U | 11/2016 |

OTHER PUBLICATIONS

International search report dated Jul. 5, 2017 for corresponding application PCT/CN2017/081327 with English translation attached.

* cited by examiner

TWO-STAGE OPERATIONAL AMPLIFIER

This is a National Phase Application filed under 35 U.S.C. 371 as a national stage of PCT/CN2017/081327, filed Apr. 21, 2017, an application claiming the benefit of Chinese Application No. 201610394391.9, filed Jun. 6, 2016, the content of each of which is hereby incorporated by reference in its entirety.

TECHNICAL FIELD

The present disclosure relates to the field of circuit design, and particularly relates to a two-stage operational amplifier.

BACKGROUND

An operational amplifier is an important component in many analog systems and mixed signal systems. A high DC gain is undoubtedly an important design parameter for the operational amplifier. As the operational amplifier is generally used to implement a feedback system, its open loop DC gain determines accuracy of a feedback system using the operational amplifier.

SUMMARY

The present disclosure provides a two-stage operational amplifier, comprising: a bias voltage generator, a first stage operational amplifier and a second stage operational amplifier, wherein the bias voltage generator is coupled to the first stage operational amplifier and the second stage operational amplifier, and configured to supply bias voltages to the first stage operational amplifier and the second stage operational amplifier, respectively;

the first stage operational amplifier is coupled to the second stage operational amplifier, and configured to provide a high gain, and the first stage operational amplifier comprises: a folded cascode amplifier circuit and a cross coupling load, the cross coupling load is coupled to a load differential pair in the folded cascode amplifier circuit, the cross coupling load comprises two transistors, the two transistors in the cross coupling load correspond to two transistors in the load differential pair, respectively, and the two transistors in the cross coupling load and the two transistors in the load differential pair constitute two current mirror structures, which are cross-coupled; and the second stage operational amplifier is configured to increase an output swing of an output signal from the first stage operational amplifier.

Optionally, the folded cascode amplifier circuit comprises:

a first transistor, having a gate coupled to a fourth bias voltage output terminal of the bias voltage generator, and a source coupled to a first power source terminal;

a second transistor, having a gate coupled to a first signal input terminal, and a source coupled to a drain of the first transistor;

a third transistor, having a gate coupled to a second signal input terminal, and a source coupled to the drain of the first transistor;

a fourth transistor, having a gate coupled to the fourth bias voltage output terminal, a source coupled to a second power source terminal, and a drain coupled to a drain of the second transistor;

a fifth transistor, having a gate coupled to the fourth bias voltage output terminal, a source coupled to the second power source terminal, and a drain coupled to a drain of the third transistor;

a sixth transistor, having a gate coupled to a third bias voltage output terminal of the bias voltage generator, and a source coupled to the drain of the fourth transistor;

a seventh transistor, having a gate coupled to the third bias voltage output terminal, a source coupled to the drain of the fifth transistor, and a drain coupled to the second stage operational amplifier;

a eighth transistor, having a gate coupled to a second bias voltage output terminal of the bias voltage generator, and a drain coupled to a drain of the sixth transistor;

a ninth transistor, having a gate coupled to the second bias voltage output terminal, and a drain coupled to a drain of the seventh transistor;

a tenth transistor, having a gate coupled to a source of the eighth transistor, a drain coupled to the source of the eighth transistor, and a source coupled to the first power source terminal; and a eleventh transistor, having a gate coupled to a source of the ninth transistor, a drain coupled to the source of the ninth transistor, and a source coupled to the first power source terminal;

wherein, the tenth transistor and the eleventh transistor constitute the load differential pair.

Optionally, the cross coupling load comprises:

a twelfth transistor, having a gate coupled to the source of the eighth transistor, a drain coupled to the source of the ninth transistor, and a source coupled to the first power source terminal; and a thirteenth transistor, having a gate coupled to the source of the ninth transistor, a drain coupled to the source of the eighth transistor, and a source coupled to the first power source terminal;

wherein the twelfth transistor and the tenth transistor constitute one current mirror structure of the two current mirror structures, and the thirteenth transistor and the eleventh transistor constitute the other current mirror structure of the two current mirror structures.

Optionally, the first transistor, the second transistor, the third transistor, the eighth transistor, the ninth transistor, the tenth transistor, the eleventh transistor, the twelfth transistor, and the thirteenth transistor are N-type MOSFETs; and the fourth transistor, the fifth transistor, the sixth transistor and the seventh transistor are P-type MOSFETs.

Optionally, a channel of the first transistor has a width of 1 μm and a length of 600 nm;

channels of the second and third transistors each has a width of 1.2 μm and a length of 600 nm;

channels of the fourth and fifth transistors each has a width of 1 μm and a length of 5 μm;

channels of the sixth and seventh transistors each has a width of 1 μm and a length of 2.5 μm;

channels of the eighth and ninth transistors each has a width of 1 μm and a length of 8 μm;

channels of the tenth and eleventh transistors each has a width of 600 nm and a length of 600 nm; and channels of the twelfth and thirteenth transistors each has a width of 600 nm and a length of 600 nm.

Optionally, the bias voltage generator comprises:

a fourteenth transistor, having a gate coupled to a first bias current input terminal and a second bias voltage output terminal, and a drain coupled to the first bias current input terminal;

a fifteenth transistor, having a gate coupled to the second bias voltage output terminal, and a drain coupled to a second bias current input terminal;

a sixteenth transistor, having a gate coupled to the second bias voltage output terminal, a drain coupled to a source of the fourteenth transistor, a source coupled to a first power source terminal;

a seventeenth transistor, having a gate coupled to a source of the fifteenth transistor and a third bias voltage output terminal, and a source coupled to the first power source terminal;

an eighteenth transistor, having a gate coupled to a first bias voltage output terminal, and a source coupled to a second power source terminal;

a nineteenth transistor, having a gate coupled to a fourth bias voltage output terminal, a source coupled to the second power source terminal, and a drain coupled to the fourth bias voltage output terminal;

a twentieth transistor, having a gate coupled to the first bias voltage output terminal, a source coupled to the drain of the eighteenth transistor, and a drain coupled to the first bias voltage output terminal;

a twenty-first transistor, having a gate coupled to the first bias voltage output terminal, and a source coupled to the drain of the nineteenth transistor;

a twenty-second transistor, having a gate coupled to the second bias voltage output terminal, and a drain coupled to the drain of the twentieth transistor;

a twenty-third transistor, having a gate coupled to the second bias voltage output terminal, and a drain coupled to a drain of the twenty-first transistor;

a twenty-fourth transistor, having a gate coupled to the third bias voltage output terminal, a drain coupled to the source of the twenty-second transistor, and a source coupled to the first power source terminal; and a twenty-fifth transistor, having a gate coupled to the third bias voltage output terminal, a drain coupled to a source of the twenty-third transistor, and a source coupled to the first power source terminal.

Optionally, the fourteenth transistor, the fifteenth transistor, the sixteenth transistor, the seventeenth transistor, the twenty-second transistor, the twenty-third transistor, the twenty-fourth transistor, and the twenty-fifth transistor are N-type MOSFETs; and the eighteenth transistor, the nineteenth transistor, the twentieth transistor and the twenty-first transistor are P-type MOSFETs.

Optionally, a channel of the fourteenth transistor has a width of 910 nm and a length of 10 µm;

a channel of the fifteenth transistor has a width of 1 µm and a length of 7.5 µm;

channels of the sixteenth and seventeenth transistors each has a width of 600 nm and a length of 10 µm;

a channel of the eighteenth transistor has a width of 750 nm and a length of 10 µm;

a channel of the nineteenth transistor has a width of 600 nm and a length of 10 µm;

a channel of the twentieth transistor has a width of 1.65 µm and a length of 10 µm;

a channel of the twenty-first transistor has a width of 10 µm and a length of 500 nm;

a channel of the twenty-second transistor has a width of 3.2 µm and a length of 1 µm;

a channel of the twenty-third transistor has a width of 1 µm and a length of 10 µm;

a channel of the twenty-fourth transistor has a width of 5 µm and a length of 4 µm; and a channel of the twenty-fifth transistor has a width of 600 nm and a length of 10 µm.

Optionally, the second stage operational amplifier comprises:

a twenty-sixth transistor, having a gate coupled to the first stage operational amplifier, a source coupled to a second power source terminal, and a drain coupled to a signal output terminal of the two-stage operational amplifier; and a twenty-seventh transistor, having a gate coupled to a first bias voltage output terminal of the bias voltage generator, a drain coupled to the signal output terminal, and a source coupled to a first power supply terminal.

Optionally, the twenty-sixth transistor is a P-type MOSFET, and the twenty-seventh transistor is an N-type MOSFET.

Optionally, a channel of the twenty-sixth transistor has a width of 9 µm and a length of 1 µm; and a channel of the twenty-seventh transistor has a width of 8 µm and a length of 800 nm.

Optionally, the two-stage operational amplifier further comprises: a Miller compensator, which comprises a resistor and a capacitor; wherein the capacitor has a first terminal coupled to an output terminal of the first stage operational amplifier, and a second terminal coupled to a first terminal of the resistor; and the resistor has a second terminal coupled to the signal output terminal of the two-stage operational amplifier.

DETAILED DESCRIPTION

In order to make a person skilled in the art better understand the technical solutions of the present disclosure, a two-stage operational amplifier according to the present disclosure will be further described in detail in conjunction with the drawings and the embodiments below.

At present, a two-stage operational amplifier based on a folded cascode structure has a higher gain while providing a larger output voltage swing. Specifically, the first stage is used to achieve a high gain and provide a proper swing, and the second stage is used to increase the output swing. However, although the existing two-stage operational amplifier can provide a high gain, its own noise (flicker noise and thermal noise) is larger, which makes the overall performance improvement of the amplifier limited.

Figure 1:
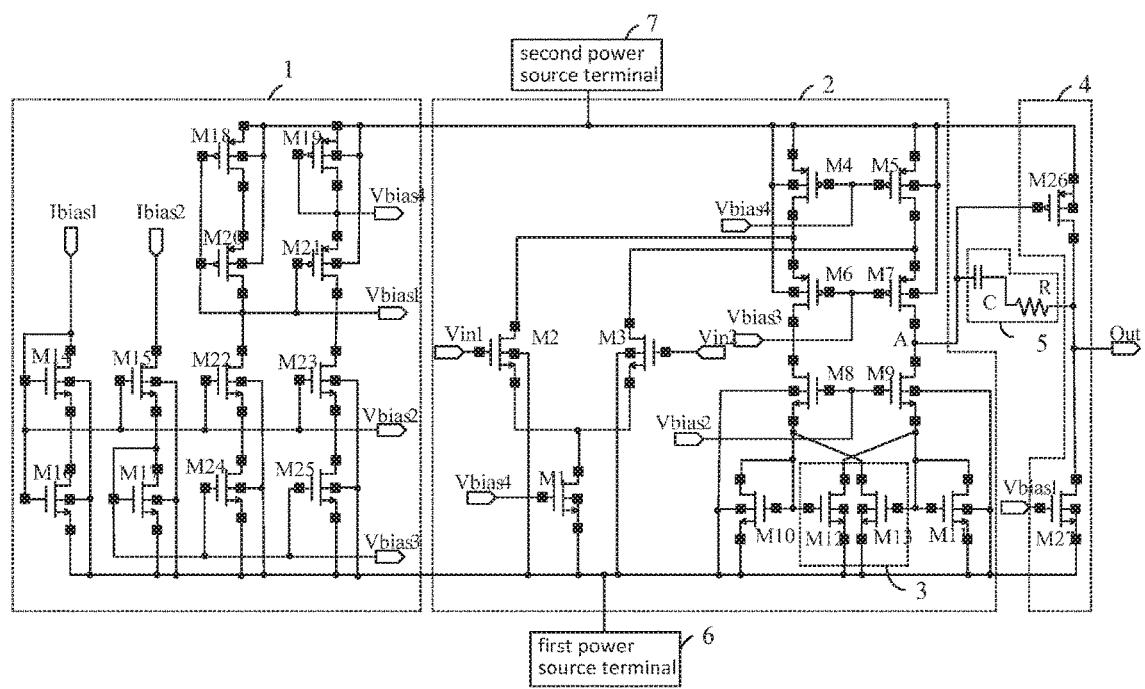
FIG. 1 is a schematic view of a structure of a two-stage operational amplifier according to an embodiment of the invention.

FIG. 1 is a schematic view of a structure of a two-stage operational amplifier according to an embodiment of the invention. As shown in FIG. 1, the two-stage operational amplifier comprises: a bias voltage generator 1, a first stage operational amplifier 2 and a second stage operational amplifier 4.

The bias voltage generator 1 is coupled to the first stage operational amplifier 2 and the second stage operational amplifier 4, and configured to supply bias voltages to the first stage operational amplifier 2 and the second stage operational amplifier 4, respectively;

The first stage operational amplifier 2 is coupled to the second stage operational amplifier 4, and configured to provide a high gain, and the first stage operational amplifier 2 comprises: a folded cascode amplifier circuit and a cross coupling load 3, the cross coupling load 3 is coupled to a load differential pair in the folded cascode amplifier circuit, the cross coupling load 3 comprises two transistors, the two transistors in the cross coupling load 3 and two corresponding transistors in the load differential pair constitute two current mirror structures, which are cross coupling.

The second stage operational amplifier 4 is configured to increase an output swing of an output signal from the first stage operational amplifier 2.

In the present disclosure, by adding the cross coupling load 3 to the load differential pair in the folded cascode amplifier circuit (also referred to as -gm compensation), two cross coupling current mirror structures are constituted, and an equivalent output impedance of the two current mirror structures (four transistors in total) is equal to a reciprocal of a transconductance difference between the two current mirror structures. In the embodiment, optionally, performance parameters (for example, aspect ratio of channel) of the two transistors in the cross coupling load 3 may be set to be the same as those of the two transistors in the load differential pair, thus two identical current mirror structures are constituted and the transductance difference between the two current mirror structures is zero (in practical, the transconductance difference between the two current mirror structures approaches to zero), and the equivalent output impedance of the two current mirror structures may be infinite, and in this case, a total output impedance of the first stage operational amplifier is accordingly increased, and a gain of the first stage operational amplifier is also accordingly increased, that is, the two stage operational amplifier in the embodiment can achieve a high gain.

As an implementation of the embodiment, optionally, the folded cascade amplifier circuit comprises:

a first transistor M1, having a gate coupled to a fourth bias voltage output terminal Vbias4 of the bias voltage generator 1, and a source coupled to a first power source terminal 6;

a second transistor M2, having a gate coupled to a first signal input terminal Vin1, and a source coupled to a drain of the first transistor M1;

a third transistor M3, having a gate coupled to a second signal input terminal Vin2, and a source coupled to the drain of the first transistor M1;

a fourth transistor M4, having a gate coupled to the fourth bias voltage output terminal Vbias4, a source coupled to a second power source terminal 7, and a drain coupled to a drain of the second transistor M2;

a fifth transistor M5, having a gate coupled to the fourth bias voltage output terminal Vbias4, a source coupled to the second power source terminal 7, and a drain coupled to the drain of the third transistor M3;

a sixth transistor M6, having a gate coupled to the third bias voltage output terminal Vbias3 of the bias voltage generator 1, and a source coupled to the drain of the fourth transistor M4;

a seventh transistor M7, having a gate coupled to the third bias voltage output terminal Vbias3, a source coupled to the drain of the fifth transistor M5, and a drain coupled to the second stage operational amplifier 4;

a eighth transistor M8, having a gate coupled to a second bias voltage output terminal Vbias2 of the bias voltage generator 1, and a drain coupled to a drain of the sixth transistor M6;

a ninth transistor M9, having a gate coupled to the second bias voltage output terminal Vbias2, and a drain coupled to the drain of the seventh transistor M7;

a tenth transistor M10, having a gate coupled to a source of the eighth transistor M8, a drain coupled to the source of the eighth transistor M8, and a source coupled to the first power source terminal 6; and an eleventh transistor M11, having a gate coupled to a source of the ninth transistor M9, a drain coupled to a source of the ninth transistor M9, and a source coupled to the first power source terminal 6;

wherein, the tenth transistor M10 and the eleventh transistor M11 constitute the load differential pair.

Optionally, the cross coupling load 3 comprises:

a twelfth transistor M12, having a gate coupled to the source of the eighth transistor M8, a drain coupled to the source of the ninth transistor M9, and a source coupled to the first power source terminal 6; and a thirteenth transistor M13, having a gate coupled to the source of the ninth transistor M9, a drain coupled to the source of the eighth transistor M8, and a source coupled to the first power source terminal 6;

wherein the twelfth transistor M12 and the tenth transistor M10 constitute one current mirror structure of the two current mirror structures, and the thirteenth transistor M13 and the eleventh transistor M11 constitute the other current mirror structure of the two current mirror structures.

Wherein, the second transistor M2 and the third transistor M3 are identical, the fourth transistor M4 and the fifth transistor M5 are identical, the sixth transistor M6 and the seventh transistor M7 are identical, the eighth transistor M8 and the ninth transistor M9 are identical, the tenth transistor M10 and the eleventh transistor M11 are identical, and the twelfth transistor M12 and the thirteenth transistor M13 are identical.

In this case, a total resistance Rout of the first stage operational amplifier 2 is:

$$R_{out} = [(g_{m6}+g_{mb6})*r_{o6}*(r_{o4}\|r_{o2})] \| [(g_{m8}+g_{mb8})*r_{o8}*r_{o(10,11,12,13)}] \quad (1)$$

Wherein, $g_{m6}$ and $g_{mb6}$ represent transconductance of the sixth transistor M6 and a substrate transconductance in consideration of bulk effect (its value is generally small), respectively; $g_{m8}$ and $g_{mb8}$ represent transconductance of the eighth transistor M8 and the substrate transconductance in consideration of bulk effect (its value is generally small), respectively; $r_{o2}$, $r_{o4}$, $r_{o6}$ and $r_{o8}$ represent output impedances of the second transistor M2, the fourth transistor M4, the sixth transistor M6 and the eight transistor M8, respectively; $r_{o(10,11,12,13)}$ represents an equivalent output impedance of the four transistors, the tenth transistor M10, the eleventh transistor M11, the twelfth transistor M12 and the thirteenth transistor M13.

The gain $|A_1|$ of the first stage operational amplifier 2 is:

$$|A_1| = g_{m2} * R_{out} \quad (2)$$
$$= g_{m2} * [(g_{m6}+g_{mb6}) * r_{o6} * (r_{o4}\|r_{o2})] \|$$
$$[(g_{m8}+g_{mb8}) * r_{o8} * r_{o(10,11,12,13)}]$$

Wherein, $g_{m2}$ represents transconductance of the second transistor M2.

Based on the above equations (1) and (2), when the equivalent output impedance of the four transistors, the tenth transistor M10, the eleventh transistor M11, the twelfth transistor M12 and the thirteenth transistor M13 is increased, the gain of the first stage operational amplifier is accordingly increased.

In the embodiment, optionally, the bias voltage generator 1 comprises:

a fourteenth transistor M14, having a gate coupled to a first bias current input terminal Ibias1 and the second bias voltage output terminal Vbias2, and a drain coupled to the first bias current input terminal Ibias1;

a fifteenth transistor M15, having a gate coupled to the second bias voltage output terminal Vbias2, and a drain coupled to a second bias current input terminal Ibias2;

a sixteenth transistor M16, having a gate coupled to the second bias voltage output terminal Vbias2, a drain coupled to a source of the fourteenth transistor M14, a source coupled to the first power source terminal 6;

a seventeenth transistor M17, having a gate coupled to a source of the fifteenth transistor M15 and the third bias voltage output terminal Vbias3, and a source coupled to the first power source terminal 6;

a eighteenth transistor M18, having a gate coupled to the first bias voltage output terminal Vbias1, and a source coupled to the second power source terminal 7;

a nineteenth transistor M19, having a gate coupled to the fourth bias voltage output terminal Vbais4, a source coupled to the second power source terminal 7, and a drain coupled to the fourth bias voltage output terminal Vbias4;

a twentieth transistor M20, having a gate coupled to the first bias voltage output terminal Vbias1, a source coupled to the drain of the eighteenth transistor M18, and a drain coupled to the first bias voltage output terminal Vbias1;

a twenty-first transistor M21, having a gate coupled to the first bias voltage output terminal Vbias1, and a source coupled to the drain of the nineteenth transistor M19;

a twenty-second transistor M22, having a gate coupled to the second bias voltage output terminal Vbias2, and a drain coupled to the source of the twentieth transistor M20;

a twenty-third transistor M23, having a gate coupled to the second bias voltage output terminal Vbais2, and a drain coupled to a drain of the twenty-first transistor M21;

a twenty-fourth transistor M24, having a gate coupled to the third bias voltage output terminal Vbias3, a drain coupled to the source of the twenty-second transistor M22, and a source coupled to the first power source terminal 6; and a twenty-fifth transistor M25, having a gate coupled to the third bias voltage output terminal Vbias3, a drain coupled to a source of the twenty-third transistor M23, and a source coupled to the first power source terminal 6.

The second stage operational amplifier 4 comprises:

a twenty-sixth transistor M26, having a gate coupled to the first stage operational amplifier 2, a source coupled to the second power source terminal 7, and a drain coupled to a signal output terminal Out; and a twenty-seventh transistor M27, having a gate coupled to a first bias voltage output terminal Vbias1 of the bias voltage generator 1, a drain coupled to the signal output terminal Out, and a source coupled to the first power supply terminal 6.

Compared to the folded cascode structure of the first stage operational amplifier 2, noise of the second stage operational amplifier 4 may be omitted. At a relatively low frequency, the second transistor M2, the third transistor M3, the fourth transistor M4, the fifth transistor M5, the tenth transistor M10, the eleventh transistor M11, the twelfth transistor M12, and the thirteenth transistor M13 are the main noise source. In this case, the flicker noise $V_{flicker}$ and thermal noise $V_{thermal}$ of the two-stage operational amplifier are respectively as follows:

$$V_{flicker}^2 = 2\left[\frac{K_{m2}}{(WL)_2 C_{ox} f} + \frac{K_{m4}}{(WL)_4 C_{ox} f} \times \frac{g_{m4}^2}{g_{m2}^2}\right] + \frac{2K_{m4}}{(WL)_4 C_{ox} f} \times \frac{g_{m4}^2}{g_{m2}^2} \quad (3)$$

$$V_{thermal}^2 = 8kT\left(\frac{\gamma}{g_{m2}} + \frac{\gamma g_{m4}}{g_{m2}^2} + \frac{\gamma g_{m(10,11,12,13)}}{g_{m2}}\right) \quad (4)$$

Wherein, $K_{m2}$ and $K_{m4}$ are flicker noise factors of the second transistor M2 and the fourth transistor M4, respectively; $(WL)_2$ and $(WL)_4$ are channel areas (product of channel length and width) of the second transistor M2 and the fourth transistor M4, respectively; $C_{ox}$ is gate oxide capacitance per unit area, f is a frequency of a signal to be processed, $\gamma$ is a constant (as for a transistor with a long channel, the value of $\gamma$ is generally ⅔; as for a submicron MOSFET, the value of $\gamma$ will be greater; in addition the value of $\gamma$ will also change with the drain-source voltage to a certain extent), K is the Boltzmann constant, T is the absolute temperature.

Based on the above equations (3) and (4), by increasing the transconductance of the second transistor M2 (the third transistor M3) and/or decreasing the transconductacne of the fourth transistor M4 (the fifth transistor M5), both the flicker noise $V_{flicker}$ and thermal noise $V_{thermal}$ may be decreased.

The transconductance $g_{m2}$ of the second transistor M2 is:

$$g_{m2} = \sqrt{2\mu_{m2} C_{ox}(W/L)_2 I_{D2}} \quad (5)$$

The transconductance $g_{m4}$ of the fourth transistor M4 is:

$$g_{m4} = \sqrt{2\mu_{m4} C_{ox}(W/L)_4 I_{D4}} \quad (6)$$

Wherein, $\mu_{m2}$ and $\mu_{m4}$ are charge carrier mobility of the second transistor M2 and the fourth transistor M4, respectively; $(W/L)_2$ and $(W/L)_4$ are width-to-length ratios of the channels of the second transistor M2 and the fourth transistor M4, respectively; and $I_{D2}$ and $I_{D4}$ are drain currents distributed to the second transistor M2 and the fourth transistor M4, respectively.

Based on the above equations (5) and (6), considering that the charge carrier mobility of the N-type MOSFET is larger than that of the P-type MOSFET, the second transistor M2 (the third transistor M3) in the embodiment is optionally an N-type MOSFET to effectively increase the transconductance of the second transistor M2; the fourth transistor M4 (the fifth transistor M5) is optionally a P-type MOSFET to effectively decrease the transconductance of the fourth transistor M4. Meanwhile, referring to the equation (3), since the flicker noise factor of the N-type MOSFET is smaller than that of the P-type MOSFET, the second transistor M2 being an N-type MOSFET can facilitate to decrease the flicker noise $V_{flicker}$.

In addition, based on the above equation (3), the channel areas of the second transistor M2 and the fourth transistor M4 being increased can also facilitate to decrease the flicker noise $V_{flicker}$. Meanwhile, from the above equations (5) and (6), it can be seen that it is also required to make the width-length ratio of the channel of the second transistor M2 as large as possible (increase the transconductance of the second transistor M2) and make the width-large ratio of the channel of the fourth transistor M4 as small as possible (decrease the transconductance of the fourth transistor M4) while the channel areas of the second transistor M2 and the fourth transistor M4 are increased. Thus, on the premise of ensuring certain channel areas, the channel width of the second transistor M2 should be set to be as large as possible and the channel length of the fourth transistor M4 should be set to be as large as possible.

Based on the above considerations, in the embodiment, optionally, channels of the second transistor M2 and the third transistor M3 each has a width of 1.2 μm and a length of 600 nm, and channels of the fourth transistor M4 and the fifth transistor M5 each has a width of 1 μm and a length of 5 μm. As such, the two-stage operational amplifier is ensured to have a high gain while achieving a low noise.

Optionally, a channel of the first transistor M1 has a width of 1 μm and a length of 600 nm, and the first transistor M1 has a large channel area and a large width-length ratio, thus making the drain current flowing to the second transistor M2 as large as possible, effectively increasing the transconductance of the second transistor M2, and facilitating noise reduction.

In the embodiment, further optionally, the first transistor M1, the eighth transistor M8, the ninth transistor M9, the tenth transistor M10, the eleventh transistor M11, the twelfth transistor M12, the thirteenth transistor M13, the fourteenth transistor M14, the fifteenth transistor M15, the sixteenth transistor M16, the seventeenth transistor M17, the twenty-second transistor M22, the twenty-third transistor M23, the twenty-fourth transistor M24, the twenty-fifth transistor M25 and the twenty-seventh transistor M27 are N-type MOSFETs; and the sixth transistor M6, the seventh transistor M7, the eighteenth transistor M18, the nineteenth transistor M19, the twentieth transistor M20, the twenty-first transistor M21, and the twenty-sixth transistor M26 are P-type MOSFETs.

Further optionally, channels of the sixth transistor M6 and the seventh transistor M7 each has a width of 1 μm and a length of 2.5 μm; channels of the eighth transistor M8 and the ninth transistor M9 each has a width of 1 μm and a length of 8 μm; channels of the tenth transistor M10 and the eleventh transistor M11 each has a width of 600 nm and a length of 600 nm; channels of the twelfth transistor M12 and the thirteenth transistor M13 each has a width of 600 nm and a length of 600 nm; a channel of the fourteenth transistor M14 has a width of 910 nm and a length of 10 μm; a channel of the fifteenth transistor M15 has a width of 1 μm and a length of 7.5 μm; channels of the sixteenth transistor M16 and the seventeenth transistor M17 each has a width of 600 nm and a length of 10 μm; a channel of the eighteenth transistor M18 has a width of 750 nm and a length of 10 μm; a channel of the nineteenth transistor M19 has a width of 600 nm and a length of 10 μm; a channel of the twentieth transistor M20 has a width of 1.65 μm and a length of 10 μm; a channel of the twenty-first transistor M21 has a width of 10 μm and a length of 500 nm; a channel of the twenty-second transistor M22 has a width of 3.2 μm and a length of 1 μm; a channel of the twenty-third transistor M23 has a width of 1 μm and a length of 10 μm; a channel of the twenty-fourth transistor M24 has a width of 5 μm and a length of 4 μm; a channel of the twenty-fifth transistor M25 has a width of 600 nm and a length of 10 μm; a channel of the twenty-sixth transistor M26 has a width of 9 μm and a length of 1 μm; and a channel of the twenty-seventh transistor M27 has a width of 8 μm and a length of 800 nm.

It should be pointed out that, the first power source terminal 6 in the embodiment is a low level terminal Vss, the second power source terminal 7 is a high level terminal Vdd, substrates of all the N-type MOSFETs are coupled to the low level terminal Vss, and substrates of all the P-type MOSFETs are coupled to the high level terminal Vdd.

Optionally, the two-stage operational amplifier further comprises: a Miller compensator 5 which is configured to perform Miller compensation. Specifically, the Miller compensator 5 comprises a resistor R and a capacitor C, the capacitor C has a first terminal coupled to an output terminal A of the first stage operational amplifier 2, and a second terminal coupled to a first terminal of the resistor R; and the resistor R has a second terminal coupled to the signal output terminal Out of the two-stage operational amplifier. In the embodiment, with the Miller compensator 5, the dominant pole and the non-dominant pole are caused to respectively move to the low frequency and the high frequency so as to make the two poles separated from each other, and a zero point in right half plane is moved to the high frequency by the resistor, thus decreasing or even eliminating the influence of the zero point on system stability.

Figure 2:
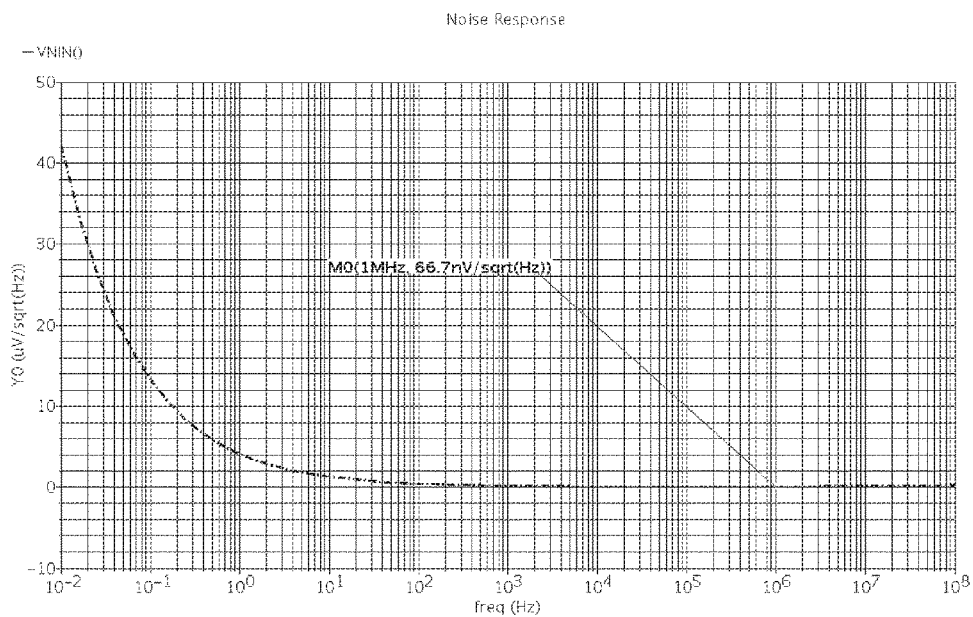
FIG. 2 is a diagram illustrating a noise characteristic curve of a two-stage operational amplifier in the prior art.
Figure 3:
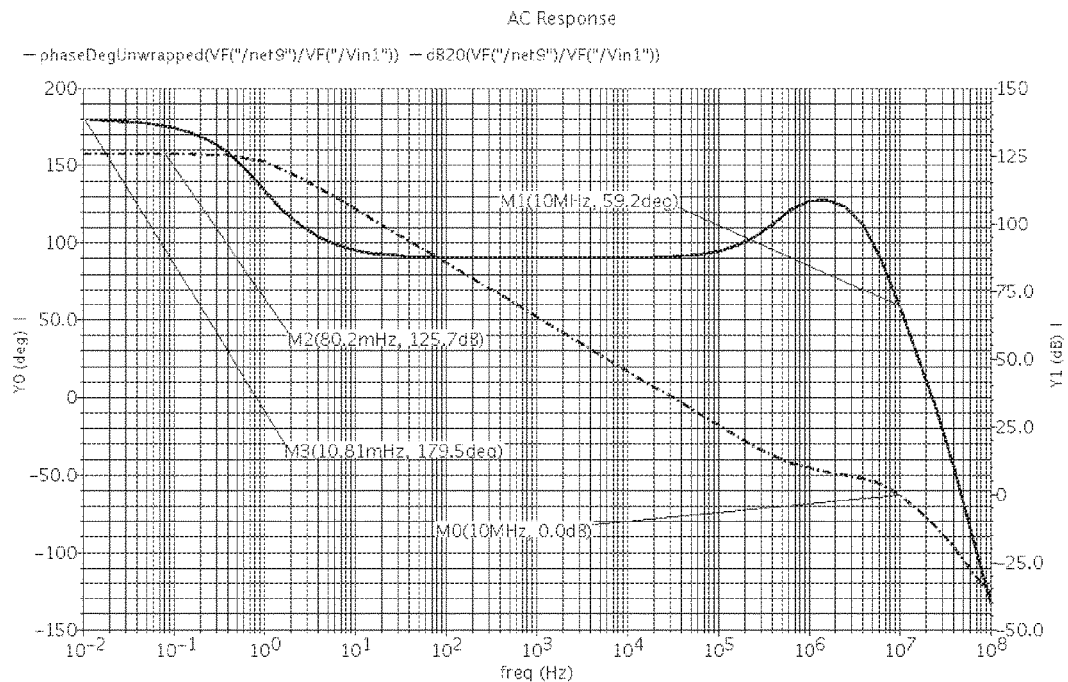
FIG. 3 is a diagram illustrating AC response curves of a two-stage operational amplifier in the prior art.

FIG. 2 is a diagram illustrating a noise characteristic curve of a two-stage operational amplifier in the prior art; and FIG. 3 is a diagram illustrating AC response curves of a two-stage operational amplifier in the prior art. As shown in FIGS. 2 and 3, the simulation tool Spectre is used to perform simulation analysis on the two-stage operational amplifier in the prior art, and the simulation results show that the two-stage operational amplifier in the prior art has a unity gain bandwidth of about 10 MHZ, a DC gain of 125.7 dB, a phase margin of 59.2°, and an input reference noise at 1 MHz of about 66.7 (nv/$\sqrt{Hz}$). Thus, it can be seen that, the two-stage operational amplifier in the prior art have a large gain and also a large noise, and cannot achieve both a large gain and a low noise.

Figure 4:
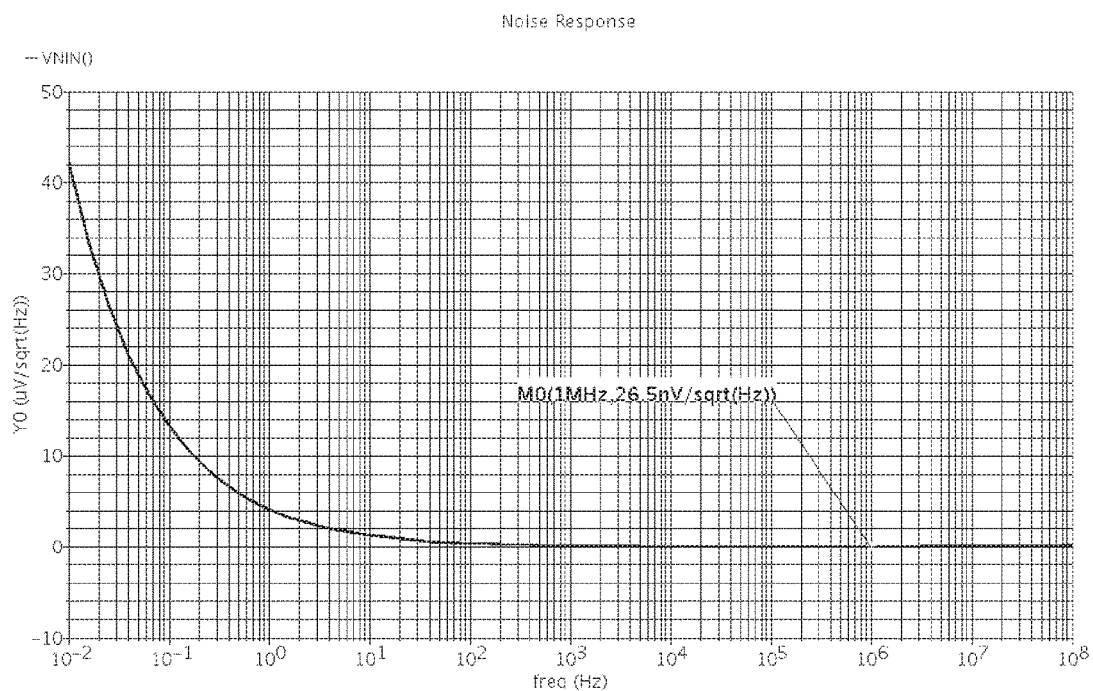
FIG. 4 is a diagram illustrating a noise characteristic curve of a two-stage operational amplifier in an embodiment of the disclosure.
Figure 5:
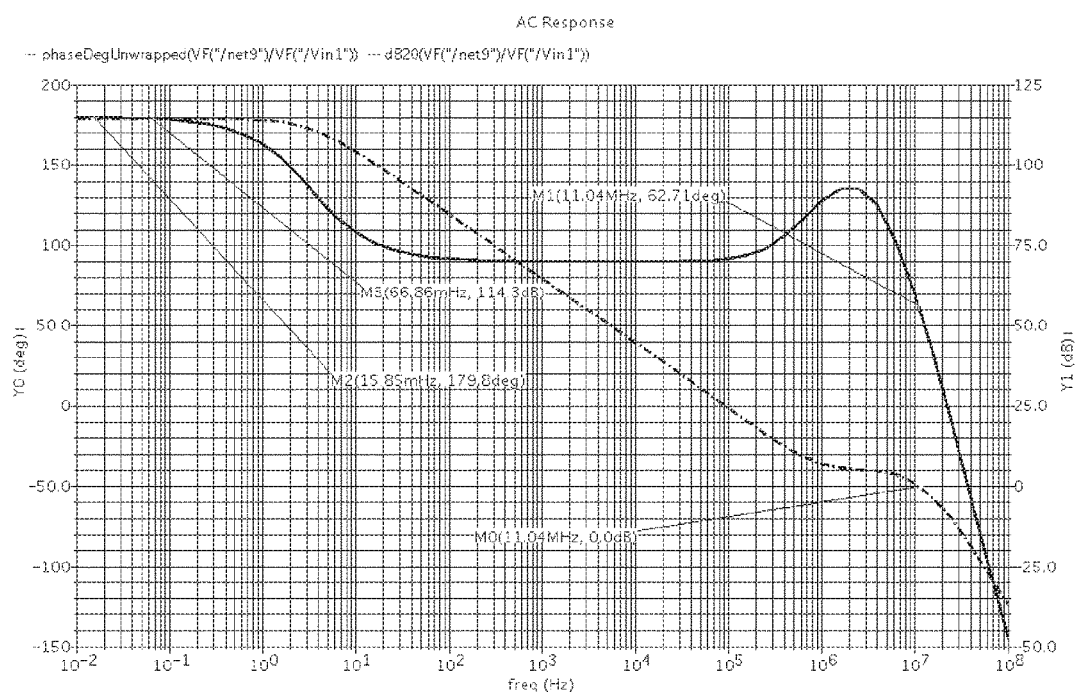
FIG. 5 is a diagram illustrating AC response curves of a two-stage operational amplifier in an embodiment of the disclosure.

FIG. 4 is a diagram illustrating a noise characteristic curve of a two-stage operational amplifier in an embodiment of the disclosure; and FIG. 5 is a diagram illustrating AC response curves of a two-stage operational amplifier in an embodiment of the disclosure. As shown in FIGS. 4 and 5, the simulation tool Spectre is used to perform simulation analysis on the two-stage operational amplifier according to the embodiment of the present disclosure, and the simulation results show that the two-stage operational amplifier in the present disclosure has a DC gain of 114.3 dB (having a still strong amplification capability), and an input reference noise at 1 MHz of about 26.5 (nv/$\sqrt{Hz}$). Compared to the prior art, the noise of the two-stage operational amplifier in the embodiment of the present disclosure has been decreased by about ⅔ times as large as the prior art. Thus, it can be seen that, the two-stage operational amplifier in the embodiment have a large gain and a low noise, and can achieve performances with both a large gain and a low noise.

It should be understood that, the above embodiments are only exemplary embodiments for the purpose of explaining the principle of the present disclosure, and the present disclosure is not limited thereto. For one of ordinary skill in the art, various improvements and modifications may be made without departing from the spirit and essence of the present disclosure. These improvements and modifications also fall within the protection scope of the present disclosure.

What is claimed is:

1. A two-stage operational amplifier, comprising: a bias voltage generator, a first stage operational amplifier and a second stage operational amplifier, wherein the bias voltage generator is coupled to the first stage operational amplifier and the second stage operational amplifier, and configured to supply bias voltages to the first stage operational amplifier and the second stage operational amplifier, respectively;

the first stage operational amplifier is coupled to the second stage operational amplifier, and configured to provide a high gain, and the first stage operational amplifier comprises: a folded cascode amplifier circuit and a cross coupling load, the cross coupling load is coupled to a load differential pair in the folded cascode amplifier circuit, the cross coupling load comprises two transistors, the two transistors in the cross coupling load correspond to two transistors in the load differential pair, respectively, and the two transistors in the cross coupling load and the two transistors in the load differential pair constitute two current mirror structures, which are cross coupled; and the second stage operational amplifier is configured to increase an output swing of an output signal from the first stage operational amplifier;

wherein the folded cascode amplifier circuit comprises:

a first transistor, having a gate coupled to a fourth bias voltage output terminal of the bias voltage generator, and a first electrode coupled to a first power source terminal;

a second transistor, having a gate coupled to a first signal input terminal, and a first electrode coupled to a second electrode of the first transistor;

a third transistor, having a gate coupled to a second signal input terminal, and a first electrode coupled to the second electrode of the first transistor;

a fourth transistor, having a gate coupled to the fourth bias voltage output terminal, a first electrode coupled to a second power source terminal, and a second electrode coupled to a second electrode of the second transistor;

a fifth transistor, having a gate coupled to the fourth bias voltage output terminal, a first electrode coupled to the second power source terminal, and a second electrode coupled to a second electrode of the third transistor;

a sixth transistor, having a gate coupled to a third bias voltage output terminal of the bias voltage generator, and a first electrode coupled to the second electrode of the fourth transistor;

a seventh transistor, having a gate coupled to the third bias voltage output terminal, a first electrode coupled to the second electrode of the fifth transistor, and a second electrode coupled to the second stage operational amplifier;

a eighth transistor, having a gate coupled to a second bias voltage output terminal of the bias voltage generator, and a second electrode coupled to a second electrode of the sixth transistor;

a ninth transistor, having a gate coupled to the second bias voltage output terminal, and a second electrode coupled to a second electrode of the seventh transistor;

a tenth transistor, having a gate coupled to a first electrode of the eighth transistor, a second electrode coupled to the first electrode of the eighth transistor, and a first electrode coupled to the first power source terminal; and a eleventh transistor, having a gate coupled to a first electrode of the ninth transistor, a second electrode coupled to the first electrode of the ninth transistor, and a first electrode coupled to the first power source terminal;

wherein, the tenth transistor and the eleventh transistor constitute the load differential pair.

2. The two-stage operational amplifier of claim wherein the cross coupling load comprises:

a twelfth transistor, having a gate coupled to the first electrode of the eighth transistor, a second electrode coupled to the first electrode of the ninth transistor, and a first electrode coupled to the first power source terminal; and a thirteenth transistor, having a gate coupled to the first electrode of the ninth transistor, a second electrode coupled to the first electrode of the eighth transistor, and a first electrode coupled to the first power source terminal;

wherein the twelfth transistor and the tenth transistor constitute one current mirror structure of the two current mirror structures, and the thirteenth transistor and the eleventh transistor constitute the other current mirror structure of the two current mirror structures.

3. The two-stage operational amplifier of claim 2, wherein the first transistor, the second transistor, the third transistor, the eighth transistor, the ninth transistor, the tenth transistor, the eleventh transistor, the twelfth transistor, and the thirteenth transistor are N-type MOSFETs; and the fourth transistor, the fifth transistor, the sixth transistor and the seventh transistor are P-type MOSFETs.

4. The two-stage operational amplifier of claim 3, wherein a channel of the first transistor has a width of 1 µm and a length of 600 nm;

channels of the second and third transistors each has a width of 1.2 µm and a length of 600 nm;

channels of the fourth and fifth transistors each has a width of 1 µm and a length of 5 µm;

channels of the sixth and seventh transistors each has a width of 1 µm and a length of 2.5 µm;

channels of the eighth and ninth transistors each has a width of 1 µm and a length of 8 µm;

channels of the tenth and eleventh transistors each has a width of 600 nm and a length of 600 nm; and channels of the twelfth and thirteenth transistors each has a width of 600 nm and a length of 600 nm.

5. The two-stage operational amplifier of claim 1, wherein the bias voltage generator comprises:

a fourteenth transistor, having a gate coupled to a first bias current input terminal and a second bias voltage output terminal, and a second electrode coupled to the first bias current input terminal;

a fifteenth transistor, having a gate coupled to the second bias voltage output terminal, and a second electrode coupled to a second bias current input terminal;

a sixteenth transistor, having a gate coupled to the second bias voltage output terminal, a second electrode coupled to a first electrode of the fourteenth transistor, a first electrode coupled to a first power source terminal;

a seventeenth transistor, having a gate coupled to a first electrode of the fifteenth transistor and a third bias voltage output terminal, and a first electrode coupled to the first power source terminal;

an eighteenth transistor, having a gate coupled to a first bias voltage output terminal, and a first electrode coupled to a second power source terminal;

a nineteenth transistor, having a gate coupled to a fourth bias voltage output terminal, a first electrode coupled to the second power source terminal, and a second electrode coupled to the fourth bias voltage output terminal;

a twentieth transistor, having a gate coupled to the first bias voltage output terminal, a first electrode coupled to the second electrode of the eighteenth transistor, and a second electrode coupled to the first bias voltage output terminal;

a twenty-first transistor, having a gate coupled to the first bias voltage output terminal, and a first electrode coupled to the second electrode of the nineteenth transistor;

a twenty-second transistor, having a gate coupled to the second bias voltage output terminal, and a second electrode coupled to the second electrode of the twentieth transistor;

a twenty-third transistor, having a gate coupled to the second bias voltage output terminal, and a second electrode coupled to a second electrode of the twenty-first transistor;

a twenty-fourth transistor, having a gate coupled to the third bias voltage output terminal, a second electrode coupled to the first electrode of the twenty-second transistor, and a first electrode coupled to the first power source terminal; and a twenty-fifth transistor, having a gate coupled to the third bias voltage output terminal, a second electrode coupled to a first electrode of the twenty-third transistor, and a first electrode coupled to the first power source terminal.

6. The two-stage operational amplifier of claim 5, wherein
the fourteenth transistor, the fifteenth transistor, the sixteenth transistor, the seventeenth transistor, the twenty-second transistor, the twenty-third transistor, the twenty-fourth transistor, and the twenty-fifth transistor are N-type MOSFETs; and
the eighteenth transistor, the nineteenth transistor, the twentieth transistor and the twenty-first transistor are P-type MOSFETs.

7. The two-stage operational amplifier of claim 6, wherein
a channel of the fourteenth transistor has a width of 910 nm and a length of 10 µm;
a channel of the fifteenth transistor has a width of 1 µm and a length of 7.5 µm;
channels of the sixteenth and seventeenth transistors each has a width of 600 nm and a length of 10 µm;
a channel of the eighteenth transistor has a width of 750 nm and a length of 10 µm;
a channel of the nineteenth transistor has a width of 600 nm and a length of 10 µm;
a channel of the twentieth transistor has a width of 1.65 µm and a length of 10 µm;
a channel of the twenty-first transistor has a width of 10 µm and a length of 500 nm;
a channel of the twenty-second transistor has a width of 3.2 µm and a length of 1 µm;
a channel of the twenty-third transistor has a width of 1µm and a length of 10 µm;
a channel of the twenty-fourth transistor has a width of 5 µm and a length of 4 µm; and
a channel of the twenty-fifth transistor has a width of 600 nm and a length of 10 µm.

8. The two-stage operational amplifier of claim 1, wherein the second stage operational amplifier comprises:
a twenty-sixth transistor, having a gate coupled to the first stage operational amplifier, a first electrode coupled to a second power source terminal, and a second electrode coupled to a signal output terminal of the two-stage operational amplifier; and
a twenty-seventh transistor, having a gate coupled to a first bias voltage output terminal of the bias voltage generator, a drain coupled to the signal output terminal, and a first electrode coupled to a first power supply terminal.

9. The two-stage operational amplifier of claim 8, wherein the twenty-sixth transistor is a P-type MOSFET, and the twenty-seventh transistor is an N-type MOSFET.

10. The two-stage operational amplifier of claim 9, wherein
a channel of the twenty-sixth transistor has a width of 9 µm and a length of 1 µm; and
a channel of the twenty-seventh transistor has a width of 8 µm and a length of 800 nm.

11. The two-stage operational amplifier of claim 8, further comprising: a Miller compensator, which comprises a resistor and a capacitor; wherein
the capacitor has a first terminal coupled to an output terminal of the first stage operational amplifier, and a second terminal coupled to a first terminal of the resistor; and
the resistor has a second terminal coupled to the signal output terminal of the two-stage operational amplifier.

12. The two-stage operational amplifier of claim 4, wherein the bias voltage generator comprises:
a fourteenth transistor, having a gate coupled to a first bias current input terminal and a second bias voltage output terminal, and a second electrode coupled to the first bias current input terminal;
a fifteenth transistor, having a gate coupled to the second bias voltage output terminal, and a second electrode coupled to a second bias current input terminal;
a sixteenth transistor, having a gate coupled to the second bias voltage output terminal, a second electrode coupled to a first electrode of the fourteenth transistor, a first electrode coupled to a first power source terminal;
a seventeenth transistor, having a gate coupled to a first electrode of the fifteenth transistor and a third bias voltage output terminal, and a first electrode coupled to the first power source terminal;
an eighteenth transistor, having a gate coupled to a first bias voltage output terminal, and a first electrode coupled to a second power source terminal;
a nineteenth transistor, having a gate coupled to a fourth bias voltage output terminal, a first electrode coupled to the second power source terminal, and a second electrode coupled to the fourth bias voltage output terminal;
a twentieth transistor, having a gate coupled to the first bias voltage output terminal, a first electrode coupled to the second electrode of the eighteenth transistor, and a second electrode coupled to the first bias voltage output terminal;
a twenty-first transistor, having a gate coupled to the first bias voltage output terminal, and a first electrode coupled to the second electrode of the nineteenth transistor;
a twenty-second transistor, having a gate coupled to the second bias voltage output terminal, and a second electrode coupled to the second electrode of the twentieth transistor;
a twenty-third transistor, having a gate coupled to the second bias voltage output terminal, and a second electrode coupled to a second electrode of the twenty-first transistor;
a twenty-fourth transistor, having a gate coupled to the third bias voltage output terminal, a second electrode coupled to the first electrode of the twenty-second transistor, and a first electrode coupled to the first power source terminal; and a twenty-fifth transistor, having a gate coupled to the third bias voltage output terminal, a second electrode coupled to a first electrode of the twenty-third transistor, and a first electrode coupled to the first power source terminal.

13. The two-stage operational amplifier of claim 12, wherein the fourteenth transistor, the fifteenth transistor, the sixteenth transistor, the seventeenth transistor, the twenty-second transistor, the twenty-third transistor, the twenty-fourth transistor, and the twenty-fifth transistor are N-type MOSFETs; and the eighteenth transistor, the nineteenth transistor, the twentieth transistor and the twenty-first transistor are P-type MOSFETs.

14. The two-stage operational amplifier of claim 13, wherein a channel of the fourteenth transistor has a width of 910 nm and a length of 10 μm;

a channel of the fifteenth transistor has a width of 1 μm and a length of 7.5 μm;

channels of the sixteenth and seventeenth transistors each has a width of 600 nm and a length of 10 μm;

a channel of the eighteenth transistor has a width of 750 nm and a length of 10 μm;

a channel of the nineteenth transistor has a width of 600 nm and a length of 10 μm;

a channel of the twentieth transistor has a width of 1.65 μm and a length of 10 μm;

a channel of the twenty-first transistor has a width of 10 μm and a length of 500 nm;

a channel of the twenty-second transistor has a width of 3.2 μm and a length of 1 μm;

a channel of the twenty-third transistor has a width of 1 μm and a length of 10 μm;

a channel of the twenty-fourth transistor has a width of 5 μm and a length of 4 μm; and a channel of the twenty-fifth transistor has a width of 600 nm and a length of 10 μm.

15. The two-stage operational amplifier of claim 14, wherein the second stage operational amplifier comprises:

a twenty-sixth transistor, having a gate coupled to the first stage operational amplifier, a first electrode coupled to a second power source terminal, and a second electrode coupled to a signal output terminal of the two-stage operational amplifier; and a twenty-seventh transistor, having a gate coupled to a first bias voltage output terminal of the bias voltage generator, a second electrode coupled to the signal output terminal, and a first electrode coupled to a first power supply terminal.

16. The two-stage operational amplifier of claim 15, wherein the twenty-sixth transistor is a P-type MOSFET, and the twenty-seventh transistor is an N-type MOSFET.

17. The two-stage operational amplifier of claim 16, wherein a channel of the twenty-sixth transistor has a width of 9 μm and a length of 1 μm; and a channel of the twenty-seventh transistor has a width of 8 μm and a length of 800 nm.

18. The two-stage operational amplifier of claim 15, further comprising: a Miller compensator, which comprises a resistor and a capacitor; wherein the capacitor has a first terminal coupled to an output terminal of the first stage operational amplifier, and a second terminal coupled to a first terminal of the resistor; and the resistor has a second terminal coupled to the signal output terminal of the two-stage operational amplifier.

19. The two-stage operational amplifier of claim 1, wherein the second stage operational amplifier comprises:

a twenty-sixth transistor, having a gate coupled to the first stage operational amplifier, a first electrode coupled to a second power source terminal, and a second electrode coupled to a signal output terminal of the two-stage operational amplifier; and a twenty-seventh transistor, having a gate coupled to a first bias voltage output terminal of the bias voltage generator, a second electrode coupled to the signal output terminal, and a first electrode coupled to a first power supply terminal.

* * * * *